United States Patent
Hada et al.

(10) Patent No.: US 6,749,989 B2
(45) Date of Patent: Jun. 15, 2004

(54) POSITIVE-WORKING PHOTORESIST COMPOSITION

(75) Inventors: Hideo Hada, Hiratsuka (JP); Satoshi Fujimura, Chigasaki (JP); Kazuhito Sasaki, Kanagawa-ken (JP); Takeshi Iwai, Sagamihara (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/996,676

(22) Filed: Nov. 30, 2001

(65) Prior Publication Data

US 2002/0068238 A1 Jun. 6, 2002

(30) Foreign Application Priority Data

Dec. 4, 2000 (JP) ........................................ 2000-369225

(51) Int. Cl.$^7$ ................................................ G03F 7/004
(52) U.S. Cl. ..................... 430/270.1; 430/905; 430/914
(58) Field of Search .............................. 430/270.1, 905, 430/914

(56) References Cited

U.S. PATENT DOCUMENTS

| | | | |
|---|---|---|---|
| 5,985,511 A | * 11/1999 | Yako et al. | 430/270.1 |
| 6,004,720 A | 12/1999 | Takechi et al. | |
| 6,013,416 A | 1/2000 | Nozaki et al. | |
| 6,239,231 B1 | 5/2001 | Fujishima et al. | |
| 6,383,713 B1 | * 5/2002 | Uetani et al. | 430/270.1 |
| 6,387,587 B1 | * 5/2002 | Oomori et al. | 430/270.1 |
| 6,406,830 B2 | * 6/2002 | Inoue et al. | 430/270.1 |
| 6,479,211 B1 | * 11/2002 | Sato et al. | |
| 2001/0016298 A1 | * 8/2001 | Nakanishi et al. | 430/270.1 |

FOREIGN PATENT DOCUMENTS

| | | |
|---|---|---|
| JP | 4-39665 | 2/1992 |
| JP | 5-346668 | 12/1993 |
| JP | 10-319595 | 12/1998 |
| JP | 11-12326 | 1/1999 |
| JP | 2000-137327 | 5/2000 |
| JP | 2000347408 | * 12/2000 |

OTHER PUBLICATIONS

"Electronics Spectrum", vol. 5, p. 35 (1999).

* cited by examiner

Primary Examiner—Rosemary Ashton
(74) Attorney, Agent, or Firm—Wenderoth, Lind & Ponack, LLP

(57) ABSTRACT

The invention discloses a positive-working photoresist composition suitable for patterning light-exposure with light having a wavelength of 200 nm or shorter. The photoresist composition comprises a resinous compound capable of being imparted with increased solubility in an aqueous alkaline solution by interaction with an acid, a radiation-sensitive acid generating compound capable of generating an acid by irradiation with a radiation and an organic solvent, in which the resinous compound is a copolymer consisting of a combination of three types of specific (meth) acrylate units as the monomeric units. The patterned resist layer formed from the photoresist composition has an advantage in respect of decreased line slimming caused by electron beam irradiation in SEM inspection.

6 Claims, No Drawings

US 6,749,989 B2

POSITIVE-WORKING PHOTORESIST COMPOSITION

BACKGROUND OF THE INVENTION

The present invention relates to a novel chemical-amplification positive-working photoresist composition suitable for patterning light-exposure with light having a wavelength of 200 nm or shorter. More particularly, the invention relates to a chemical-amplification positive-working photoresist composition capable of giving a finely patterned resist layer with little line slimming.

It is an established formulation of chemical-amplification photoresist compositions that the composition is compounded with a resinous ingredient having high transparency to the KrF excimer laser beams of 248 nm wavelength such as a polyhydroxystyrene resin optionally substituted for the hydroxyl groups by acid-dissociable solubility-reducing groups.

Along with the trend in the technology of semiconductor devices toward more and more increased density of integration, however, the subject matter of development works relative to the photolithographic patterning technology is currently establishment of a patterning process by using ArF excimer laser beams of 193 nm wavelength. When the patterning exposure is conducted with such a short-wavelength light, the hydroxystyrene-based polymeric resinous ingredient compounded in the photoresist compositions can no longer be satisfactory because transparency of the resin to the 193 nm wavelength lights is not high enough due to the benzene rings contained in the polymeric molecular structure.

With an object to solve this problem, a great number of proposals are made for a chemical-amplification positive-working photoresist composition compounded with a polymer comprising the monomeric units of a (meth)acrylic acid ester having, in place of the benzene ring, an adamantyl ring as a part of the monomeric units constituting the polymeric structure (see Japanese Patent No. 2881969 and Japanese Patent Kokai 5-346668, 7-234511, 9-73173, 9-90637, 10-161313, 10-319595 and 11-12326).

A proposal was made recently in Japanese Patent Kokai 2000-137327 for a chemical-amplification positive-working photoresist composition suitable for patterning with ArF excimer laser beams or KrF excimer laser beams and capable of giving a finely patterned resist layer with excellent sensitivity and pattern resolution and exhibiting good adhesion to the substrate surface and high resistance against dry etching, in which the resinous ingredient is a copolymer of (meth)acrylonitrile and 3-hydroxy-1-adamantyl ester of (meth)acrylic acid.

In view of further narrowing of the design rule required in the modern manufacturing process of semiconductor devices, a pattern resolution not exceeding 150 nm or in the vicinity of 100 nm must be accomplished so that upgrading of the photoresist compositions is eagerly desired relative to the pattern resolution. In addition, a solution is desired for the problem of line slimming which is a phenomenon that slimming of the line width of a patterned resist layer proceeds during inspection of the resist pattern by using a scanning electron microscope (SEM). According to the report appearing in Journal of Photopolymer Science Technology, volume 13 (4), page 497 (2000), the mechanism leading to this phenomenon of line slimming is that the crosslinking reaction of the resinous ingredient in the line-patterned resist layer proceeds as promoted by the electron beam irradiation in the SEM.

While the influence of this line slimming on the photolithographic patterning process in the manufacture of semiconductor devices is increased so much as the fineness of the design rule therein is increased and solution of this problem is eagerly sought, none of the conventional chemical-amplification positive-working photoresist compositions can meet this requirement.

SUMMARY OF THE INVENTION

The present invention accordingly has an object, in view of the above described problems in the prior art, to provide a novel and improved chemical-amplification positive-working photoresist composition capable of giving a finely patterned photoresist layer with little line slimming by the patterning exposure to light of a 200 nm or shorter wavelength such as ArF excimer laser beams in addition to the excellent sensitivity and pattern resolution as well as good adhesion to the substrate surface and high resistance against dry etching.

Thus, the positive-working photoresist composition provided by the present invention comprises, as a uniform solution in an organic solvent:

(A) a resinous compound capable of being imparted with increased solubility in an aqueous alkaline solution by interaction with an acid;

(B) a radiation-sensitive acid generating compound capable of generating an acid by irradiation with a radiation;

(C) an organic solvent, the component (A) being a copolymer consisting of the monomeric units of (a1) 2-alkyl-2-adamantyl(meth)acrylate units, (a2) (meth)acrylate ester units each having an acid-dissociable 2-oxooxapentyl group, and (a3) 1-hydroxyadamantyl(meth)acrylate units, in a specified molar proportion.

DETAILED DESCRIPTION OF THE PREFERRED EMBODIMENTS

The component (A) in the inventive photoresist composition is a resinous compound capable of being imparted with increased solubility in an aqueous alkaline solution when interacted with an acid. A typical resinous compound to meet this definition is a homopolymer of copolymer comprising the monomeric units derived from an acrylate or methacrylate ester substituted by acid-dissociable solubility-reducing groups. When interacted by an acid, the ester-forming groups in the monomeric units are dissociated to regenerate the carboxyl groups of the (meth)acrylic acid units so that the resin is imparted with increased alkali solubility.

The resinous compound as the component (A) in the inventive photoresist composition characteristically comprises three different types of the monomeric units including (a1) the monomeric units derived from a 2-alkyl-2-adamantyl(meth)acrylate, (a2) the monomeric units derived from a (meth)acrylate having a 2-oxooxapentyl group in the molecule and (a3) the monomeric units derived from 1-hydroxyadamantyl(meth)acrylate.

The monomeric units (a1) and (a2) in the resinous compound as the component (A) contribute to the improvement of the resist layer relative to sensitivity, pattern resolution, resistance against dry etching and adhesion to the substrate surface. The monomeric units (a3) as combined with the units (a1) and (a2) have an effect of decreasing the line slimming of the patterned resist layer.

The monomeric unit (a1) is represented by the general formula:

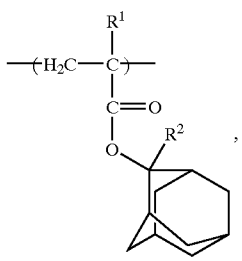

(I)

in which $R^1$ is a hydrogen atom or a methyl group and $R^2$ is an alkyl group having 1 to 4 carbon atoms such as methyl, ethyl and propyl groups. The acid-dissociability of the ester-forming adamantyl group is increased as the number of carbon atoms in the alkyl group $R^2$ is increased so that the sensitivity of the photoresist composition is increased. Since the 2-alkyladamantyl group is dissociated by interaction with an acid generated from the component (B) to regenerate the carboxyl group of the (meth)acrylic acid by irradiating the photoresist layer with a radiation, the resist layer is imparted with increased alkali-solubility in the exposed areas while the resist layer in the unexposed areas remains alkali-insoluble to retain excellent resistance against dry etching.

The monomeric unit (a2) of the second type is a (meth)acrylate ester unit represented by the general formula:

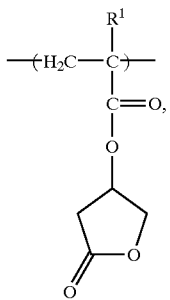

(II)

in which $R^1$ has the same meaning as defined above and of which the ester-forming group is a 2-oxooxapentyl group forming an ester linkage at the 4-position. The 2-oxooxapentyl group is also dissociable by interaction with an acid and behaves in a similar way to the above-described adamantyl groups in the exposed and unexposed areas of the photoresist layer. The 2-oxooxapentyl-containing monomeric units (a2) play a role to improve the sensitivity and pattern resolution of the photoresist layer along with the effect of increasing the adhesion of the resist layer to the substrate surface.

The monomeric unit (a3) of the third type is a unit derived from 1-hydroxyadamantyl(meth)acrylate and represented by the general formula:

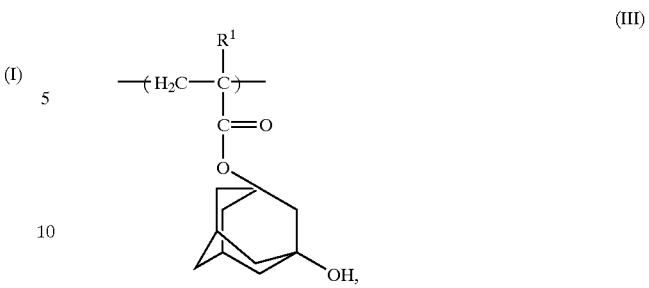

in which $R^1$ has the same meaning as defined above. The ester linkage in this monomeric unit is not dissociable in the presence of an acid so that, by virtue of the bulkiness of the polycyclic adamantyl groups, the monomeric units (a3) serve to improve the resistance of the resist layer against dry etching. By virtue of the polarity of the hydroxyl groups therein, furthermore, the monomeric units (a3) serve to decrease line slimming of the patterned resist layer.

The resinous compound as the component (A) is constituted of the above described three types of the monomeric units (a1), (a2) and (a3) as combined in such a molar proportion that the molar fractions of the units (a1), (a2) and (a3) are in the range from 20 to 80% or, preferably, from 30 to 60%, in the range from 10 to 60% or, preferably, from 20 to 50% and in the range from 10 to 60% or, preferably, from 20 to 40%, respectively. The resinous compound as the component (A) has a weight-average molecular weight in the range from 5000 to 20000 or, preferably, from 8000 to 15000.

It is optional according to need that the mixture of the comonomers from which the above described monomeric units (a1), (a2) and (a3) are derived by copolymerization is further admixed with a variety of other ethylenically unsaturated monomeric carboxylic acid compounds including (meth)acrylic acid derivatives containing a functional group known to exhibit an effect of dry-etching resistance or non-acid-dissociable solubility-reducing group and carboxylic acid monomers to increase the alkali-solubility of the resist layer such as (meth)acrylic acid, maleic acid and fumaric acid as well as those known monomeric compounds used in the preparation of acrylic resins.

The above mentioned (meth)acrylic acid derivatives are exemplified by 1-adamantyl(meth)acrylate, 2-adamantyl(meth)acrylate, cyclohexyl(meth)acrylate, naphthyl(meth)acrylate, benzyl(meth)acrylate, 3-oxocyclohexyl(meth)acrylate, bicyclo[2.2.1]heptyl(meth)acrylate, tricyclodecanyl(meth)acrylate, terpineol ester of (meth)acrylic acid and 3-bromoacetone ester of (meth)acrylic acid as the examples of the (meth)acrylate ester monomers of which the carboxylic hydroxyl group is substituted by a substituent group having an effect of dry-etching resistance improvement or a non-acid-dissociable solubility-reducing substituent group.

Examples of the ethylenically unsaturated carboxylic acid compound include acrylic acid, methacrylic acid, maleic acid and fumaric acid. Examples of the monomeric compounds used in the preparation of acrylic resins include acrylic acid esters such as methyl acrylate, ethyl acrylate, propyl acrylate, isopropyl acrylate, n-butyl acrylate, isobutyl acrylate, n-hexyl acrylate, octyl acrylate, 2-ethylhexyl acrylate, dodecyl acrylate, 2-hydroxyethyl acrylate and 2-hydroxypropyl acrylate as well as corresponding methacrylic acid esters.

The resinous compound as the component (A) can be prepared by a known procedure of radical-copolymerization in which a mixture of the respective comonomers in a specified proportion is admixed with a radical polymerization initiator such as azobisisobutyronitrile and the comonomer mixture is heated at an elevated temperature.

The component (B) compounded in the inventive photoresist composition in combination with the above described component (A) is a radiation-sensitive acid-generating compound which is a compound capable of being decomposed by irradiation with a radiation to generate a free acid compound. The acid-generating compound as the component (B) in the present invention is not particularly limitative and can be selected from known acid-generating compounds formulated in conventional chemical-amplification photoresist compositions.

Examples of suitable acid-generating compounds as the component (B) include onium salt compounds such as diphenyliodonium trifluoromethanesulfonate, (4-methoxyphenyl)phenyliodonium trifluoromethanesulfonate, bis(4-tert-butylphenyl)iodonium trifluoromethanesulfonate, triphenylsulfonium trifluoromethanesulfonate, (4-methoxyphenyl) diphenylsulfonium trifluoromethanesulfonate, (4-tert-butylphenyl)diphenylsulfonium trifluoromethanesulfonate, diphenyliodonium nonafluorobutanesulfonate, bis(4-tert-butylphenyl)iodonium nonafluorobutanesulfonate and triphenylsulfonium nonafluorobutanesulfonate, of which those onium salt compounds having a fluorinated alkylsulfonic acid ion as the anionic counter part are particularly preferable.

The above named acid-generating compounds as the component (B) can be used either singly or as a combination of two kinds or more. The amount of the component (B) in the inventive photoresist composition is in the range from 0.5 to 30 parts by weight or, preferably, from 1 to 10 parts by weight per 100 parts by weight of the component (A). When the amount of the component (B) is too small, pattern formation of the resist layer cannot be fully accomplished while, when the amount is too large, difficulties are encountered in the preparation of a uniform composition due to the limited miscibility of the compound or, even if it could ever be obtained, the photoresist solution suffers low storage stability.

The component (C) in the inventive photoresist composition is an organic solvent in which the above described components (A) and (B) are dissolved to give a uniform solution. Examples of suitable organic solvents include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate.

Although any of the above named organic solvents can be used as the component (C) either singly or as a mixture of two kinds or more, it is particularly preferable that the component (C) is a mixture of propyleneglycol monomethyl ether acetate and/or ethyl lactate with γ-butyrolactone in a mixing proportion of 70:30 to 95:5 by weight.

When further improvements are desired in the cross sectional profile of the patterned resist layer and the holding stability of the resist layer, it is optional that the inventive photoresist composition is admixed, as the component (D) with a secondary or tertiary aliphatic amine compound such as trimethylamine, diethylamine, triethylamine, di-n-propylamine, tri-n-propylamine, tri-n-pentylamine, diethanolamine and triethanolamine.

Although any of these amine compounds can be used either singly or as a combination of two kinds or more, it is particularly preferable that the amine compound as the component (D) is selected from trialkanolamines. The amount of the component (D), when added, is in the range from 0.01 to 0.2 part by weight per 100 parts by weight of the component (A).

It is of course optional according to need that the inventive photoresist composition is further admixed with a variety of known additives including auxiliary resins to improve the film properties of the resist layer, surface active agents to improve the coating workability of the composition, solubility reducing agents, plasticizers, stabilizers, coloring agents, halation inhibitors and so on.

The photolithographic patterning process by using the inventive photoresist composition is not particularly different from those by using conventional photoresist compositions. Namely, in the first place, a substrate such as a semiconductor silicon wafer is uniformly coated with the photoresist solution by using a suitable coating machine such as a spinner followed by drying to form a dried photoresist layer on the substrate surface which is patternwise exposed to ArF excimer laser beams through a photomask bearing a desired pattern on an ArF excimer laser exposure machine and subjected to a post-exposure baking treatment to build up a latent image of the pattern. The photoresist layer is then subjected to a development treatment by using a 0.1 to 10% by weight aqueous solution of tetramethylammonium hydroxide followed by rinse with water and drying to give a patterned resist layer having fidelity to the photomask pattern.

Although the inventive photoresist composition has been developed for patterning light-exposure with ArF excimer laser beams, in particular, radiations of shorter wavelengths are also applicable to the inventive photoresist composition including $F_2$ laser beams, EUV (extreme ultraviolet light), VUV (vacuum ultraviolet light), electron beams, X-rays and soft X-rays.

In the following, the photoresist composition of the present invention is described in more detail by way of Examples, in which the term of "parts" always refers to "parts by weight". In the following Example and Comparative Examples, the photoresist compositions prepared there were subjected to evaluation for the testing items (1) and (2) given below by the respective testing procedures described there.

(1) Resistance Against Dry Etching

The resist layer on a substrate surface was subjected to dry etching in an etching machine (Model OAPM-2400, manufactured by Tokyo Ohka Kogyo Co.) where the etching gas was a 30:30:100 by volume gaseous mixture of tetrafluoromethane, trifluoromethane and helium and the amount of film thickness reduction was determined as a measure of the resistance.

(2) Line Slimming

An isolated line pattern was formed in the photoresist layer and the line pattern was irradiated with electron beams on a measuring scanning electron microscope (Model S-8820, manufactured by Hitachi Ltd.) to determine the widths of the line pattern before and after the irradiation.

EXAMPLE 1

A positive-working photoresist solution was prepared by uniformly dissolving, in 700 parts of propyleneglycol monomethyl ether acetate, 100 parts of a copolymeric resin having a weight-average molecular weight of 10000 and consisting of 40% by moles of the monomeric units of the first type expressed by the formula:

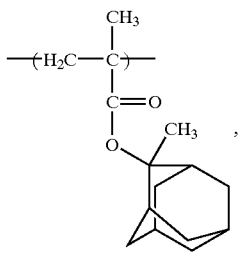

20% by moles of the monomeric units of the second type expressed by the formula:

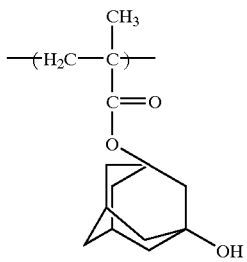

and 40% by moles of the monomeric units of the third type expressed by the formula:

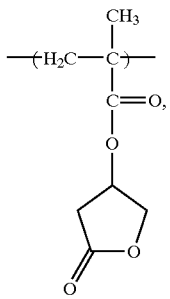

2.0 parts of triphenylsulfonium nonafluorobutanesulfonate and 0.2 part of triethanolamine followed by filtration through a membrane filter.

A semiconductor silicon wafer provided in advance with an antireflection coating film of 82 nm thickness by using an organic antireflection coating agent (AR-19, a product by Shipley Co) was coated with the thus prepared photoresist solution on a spinner followed by a prebaking treatment on a hot plate at 140° C. for 90 seconds to form a dried photoresist layer of 400 nm thickness. The photoresist layer was then patternwise exposed to ArF excimer laser beams of 193 nm wavelength on an ArF exposure machine (Model Micro Step, manufactured by ISI Co.) followed by a post-exposure baking treatment at 120° C. for 90 seconds and then subjected to a puddle development treatment by using a 2.38% by weight aqueous solution of tetramethylammonium hydroxide as the developer solution at 23° C. for 60 seconds followed by rinse with water for 30 seconds and drying to give a patterned resist layer.

The line-and-space pattern obtained in the above described manner had a critical resolution of 120 nm and the line:space width ratio thereof was exactly 1:1. The exposure dose as a measure of the sensitivity of the photoresist composition was 30.0 mJ/cm$^2$. The line-and-space pattern of 130 nm line width with a line:space width ratio of 1:1 had an excellently orthogonal cross sectional profile and the focusing depth latitude here was 800 nm. No falling of the resist layer was found in this patterned resist layer indicating good adhesion of the layer to the substrate surface.

The value of film thickness reduction by dry etching was 70 nm and the phenomenon of line slimming was extremely small with line widths of 100 nm and 95 nm before and after, respectively, the electron beam irradiation.

Comparative Example 1

The experimental procedure was substantially the same as in Example 1 described above excepting for the replacement of the copolymeric resin with the same amount of another copolymeric resin having a weight-average molecular weight of 10000 and consisting of 40% by moles of the monomeric units of the first type, 20% by moles of the monomeric units of the second type and 40% by moles of the monomeric units of a fourth type expressed by the formula:

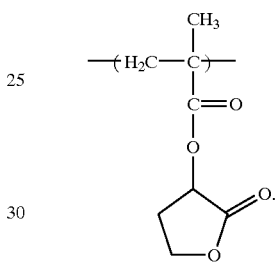

The critical resolution of a line-and-space pattern formed with the above prepared photoresist solution was 130 nm when the line:space width ratio was 1:1 showing some inferiority to that of Example 1. The sensitivity was 55 mJ/cm$^2$. A 1:1 line-and-space pattern of 140 nm line width was found to have a good orthogonal cross sectional profile but a line-and-space pattern of 130 nm line width had an unacceptable cross sectional profile with a focusing depth latitude of 600 nm. This photoresist composition exhibited about equivalent performance to that in Example 1 relative to film falling off the substrate surface, adhesion of the resist layer to the substrate surface, resistance against dry etching and line slimming.

Comparative Example 2

The experimental procedure was substantially the same as in Comparative Example 1 described above excepting for the replacement of the copolymeric resin with the same amount of a further different copolymeric resin consisting of each 50% by moles of the monomeric units of the first type and monomeric units of the fourth type.

A line-and-space pattern of 130 nm line width could be formed with a line:space width ratio of 1:1 and the sensitivity therefor was 50 mJ/cm$^2$. The cross sectional profile of a 1:1 line-and-space pattern of 140 nm line width was found good with orthogonality but a 1:1 line-and-space pattern of 130 nm line width had an unacceptable cross sectional profile.

No film falling was noted in the above mentioned patterned resist layers indicating good adhesion thereof to the substrate surface. The film thickness reduction by dry etching was 90 nm and the line slimming thereby was such that the width of 100 nm of a line pattern before electron beam irradiation was reduced to 85 nm thereby.

Comparative Example 3

The experimental procedure was substantially the same as in Example 1 excepting for the replacement of the copolymeric resin as the component (A) with the same amount of another copolymeric resin consisting of each 50% by moles of the first and third type monomeric units without the second type monomeric units.

A line-and-space pattern of 130 nm line width could be formed with a line:space width ratio of 1:1 and the sensitivity therefor was 44 mJ/cm². The cross sectional profile of a 1:1 line-and-space pattern of 140 nm line width was found good with orthogonality but a 1:1 line-and-space pattern of 130 nm line width had an unacceptable cross sectional profile.

No film falling was noted in the above mentioned patterned resist layers indicating good adhesion thereof to the substrate surface. The film thickness reduction by dry etching was 81 nm and the line slimming was such that the width of 100 nm of a line pattern before electron beam irradiation was reduced to 85 nm thereby.

What is claimed is:

1. A positive-working photoresist composition which comprises, as a uniform solution in an organic solvent:
    (A) 100 parts by weight of a resinous compound capable of being imparted with increased solubility in an aqueous alkaline solution by interaction with an acid;
    (B) from 0.5 to 30 parts by weight of a radiation-sensitive acid generating compound capable of generating an acid by irradiation with a radiation; and
    (C) an organic solvent in an amount sufficient to dissolve the components (A) and (B), the component (A) being a copolymer consisting of the monomeric units of
    (a1) from 30 to 60% by moles of 2-alkyl-2-adamantyl (meth)acrylate units having the formula:

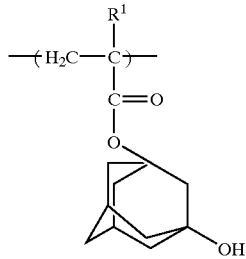

in which R¹ is a hydrogen atom or a methyl group and R² is an alkyl group having 1 to 4 carbon atoms,
    (a2) from 20 to 50% by moles of 2-oxooxapentyl(meth)acrylate units having the formula:

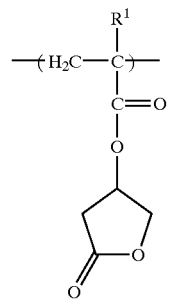

in which R¹ is a hydrogen atom or a methyl group,
    (a3) from 20 to 40% by moles of 1-hydroxyadamantyl (meth)acrylate units.

2. The positive-working photoresist composition as claimed in claim 1 in which the monomeric unit (a3) is a unit represented by the general formula:

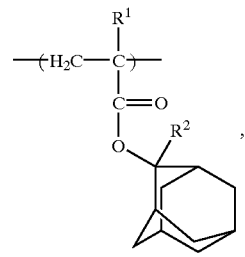

in which R¹ is a hydrogen atom or a methyl group.

3. The positive-working photoresist composition as claimed in claim 1 in which the component (B) is an onium salt compound having a fluorinated alkylsulfonic acid ion as the anionic counterpart.

4. The positive-working photoresist composition as claimed in claim 1 in which the component (C) is a mixture of (c1) propyleneglycol monomethyl ether acetate, ethyl lactate or a combination thereof and (c2) γ-butyrolactone in a mixing proportion of 70:30 to 95:5 by weight.

5. The positive-working photoresist composition as claimed in claim 1 which further comprises (D) from 0.01 to 0.2 part by weight of a secondary or tertiary aliphatic amine compound per 100 parts by weight of the component (A).

6. The positive-working photoresist composition as claimed in claim 5 in which the component (D) is a trialkanol amine.

* * * * *

UNITED STATES PATENT AND TRADEMARK OFFICE
CERTIFICATE OF CORRECTION

PATENT NO. : 6,749,989 B2 Page 1 of 1
APPLICATION NO. : 09/996676
DATED : June 15, 2004
INVENTOR(S) : Hideo Hada et al.

It is certified that error appears in the above-identified patent and that said Letters Patent is hereby corrected as shown below:

Column 9, lines 37-48:
formula " 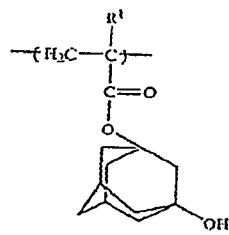 " should read -- 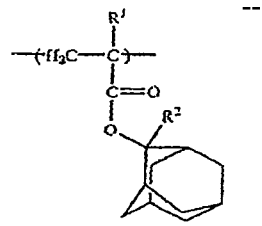 --;

Column 10, lines 22-32:
formula " 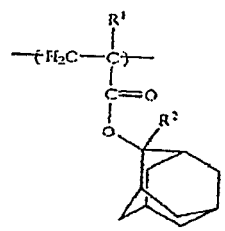 " should read -- 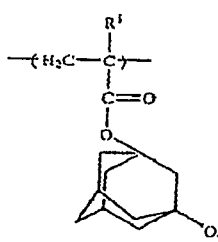 --.

Signed and Sealed this

Fourteenth Day of November, 2006

JON W. DUDAS
*Director of the United States Patent and Trademark Office*